United States Patent
Matsuo et al.

(10) Patent No.: US 7,598,655 B2
(45) Date of Patent: Oct. 6, 2009

(54) PIEZOELECTRIC TRANSFORMER DRIVING APPARATUS AND PIEZOELECTRIC TRANSFORMER DRIVING METHOD

(75) Inventors: Yasuhide Matsuo, Tokyo (JP); Akira Mizutani, Saitama (JP)

(73) Assignee: Tamura Corporation, Tokyo (JP)

(*) Notice: Subject to any disclaimer, the term of this patent is extended or adjusted under 35 U.S.C. 154(b) by 436 days.

(21) Appl. No.: 10/572,735

(22) PCT Filed: Oct. 6, 2004

(86) PCT No.: PCT/JP2004/014742

§ 371 (c)(1),
(2), (4) Date: Mar. 21, 2006

(87) PCT Pub. No.: WO2005/034323

PCT Pub. Date: Apr. 14, 2005

(65) Prior Publication Data

US 2007/0120441 A1    May 31, 2007

(30) Foreign Application Priority Data

Oct. 6, 2003    (JP)    ............... 2003-347272

(51) Int. Cl.
*H01L 41/107*    (2006.01)
(52) U.S. Cl. .................. 310/318; 310/359
(58) Field of Classification Search ............. 310/359, 310/318
See application file for complete search history.

(56) References Cited

U.S. PATENT DOCUMENTS 3,707,636 A * 12/1972 Inoue ................. 310/318
4,459,505 A * 7/1984 Lim .................. 310/318
6,087,757 A   7/2000 Honbo et al.
7,233,113 B2 * 6/2007 Ongaro et al. .......... 315/219
2001/0035698 A1  11/2001 Nakatsuka et al.

FOREIGN PATENT DOCUMENTS

| DE | 3300669 | 11/1983 |
|---|---|---|
| JP | 10-144977 | 5/1998 |
| JP | 11-8087 | 1/1999 |
| JP | 2000-069759 | 3/2000 |
| JP | 2000069759 A * | 3/2000 |
| JP | 2000-307165 | 11/2000 |
| JP | 2002-164185 | 6/2002 |

* cited by examiner

*Primary Examiner*—Jaydi SanMartin
(74) *Attorney, Agent, or Firm*—Dennis G. LaPointe

(57) ABSTRACT

A piezoelectric transformer driving apparatus and a piezoelectric transformer driving method, wherein even if there exists a variation between piezoelectric transformers, no unnecessary resonant points occur in the vicinity of a frequency used, that is, the output is stable for the frequency. For this purpose, the primary electrodes (1b, 2a) of a pair of piezoelectric transformers (1, 2) that exhibit potentials of mutually different signs on their respective secondary sides are connected to each other, while the piezoelectric transformers (1, 2) are connected in series with an AC power supply. An input voltage is applied between the primary electrodes (1a, 2b), and the outputs are supplied to a load, whereby even if there exists a variation between the vibrations of the piezoelectric transformers, it results in only a single resonant point existing.

5 Claims, 7 Drawing Sheets

Fig. 3
(a)
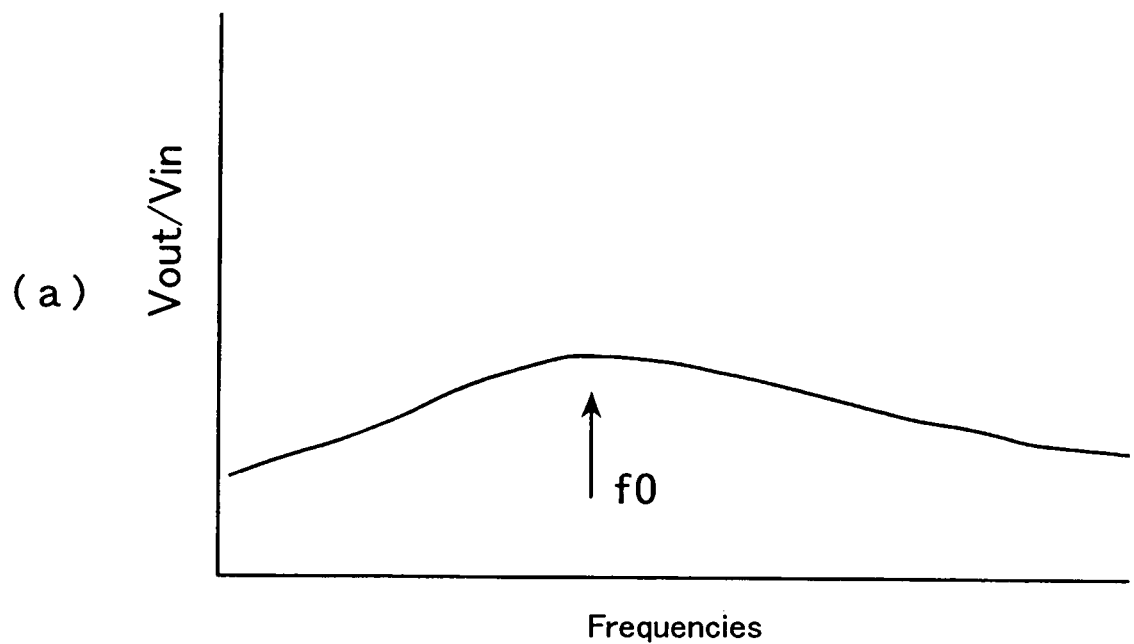
(b)
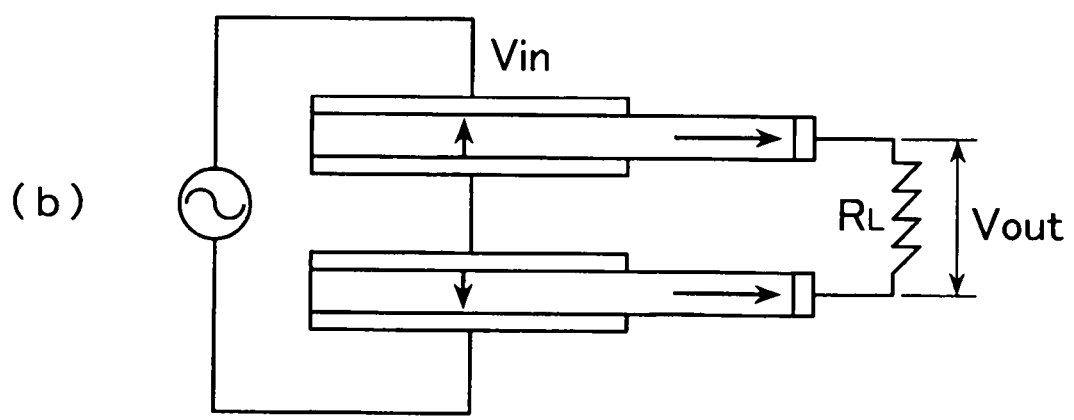

Fig. 6
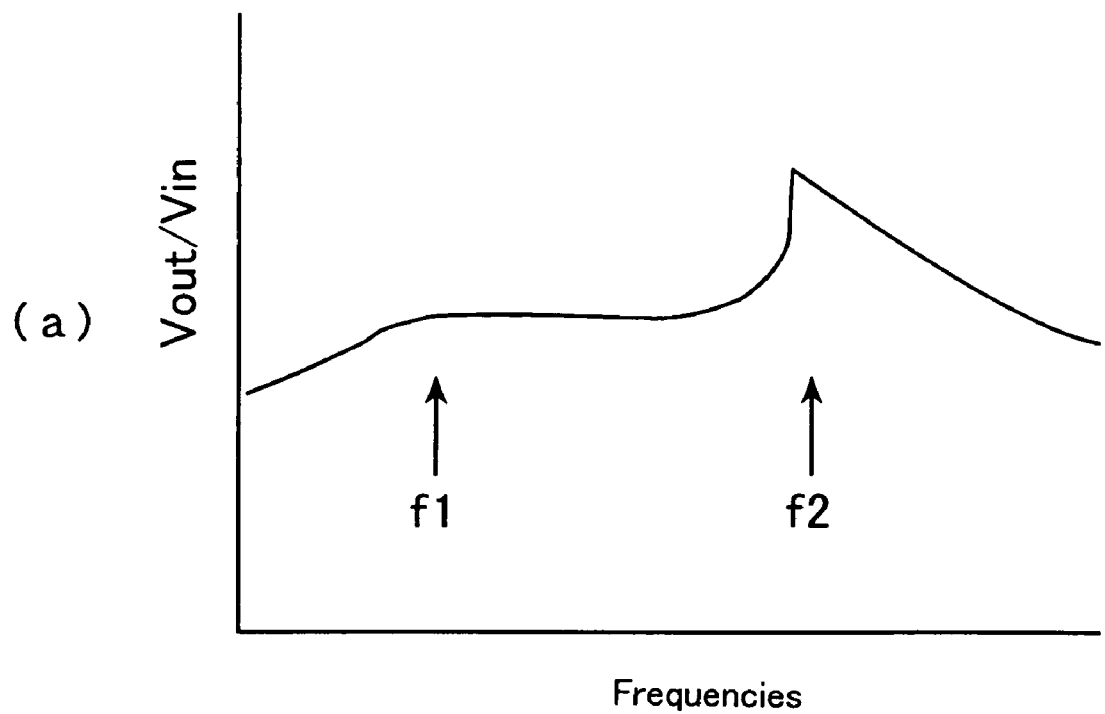
(a)
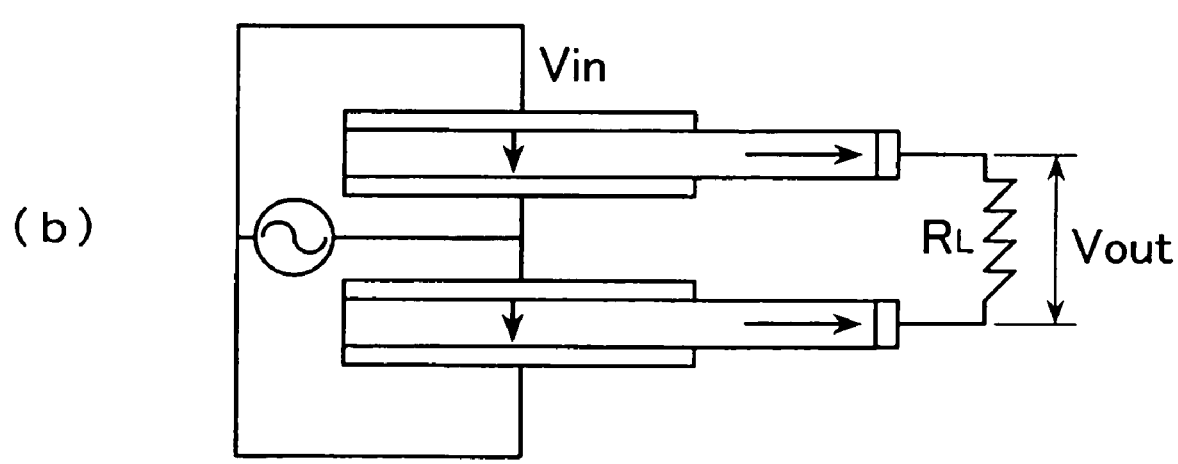
(b)

Fig. 7
(a)
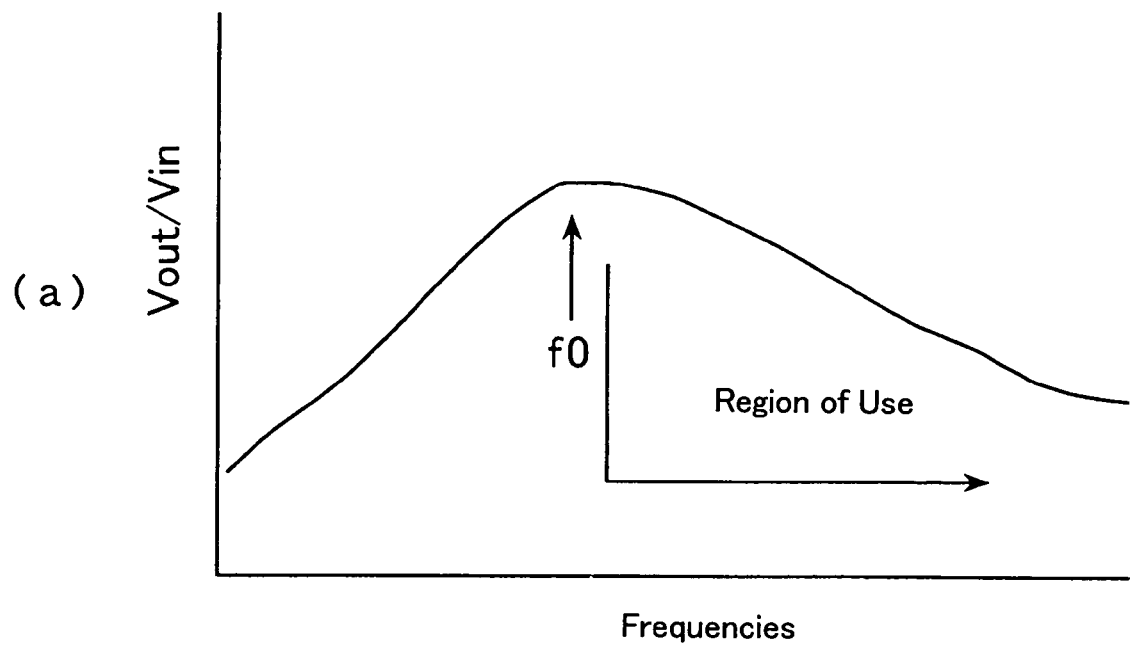
(b)
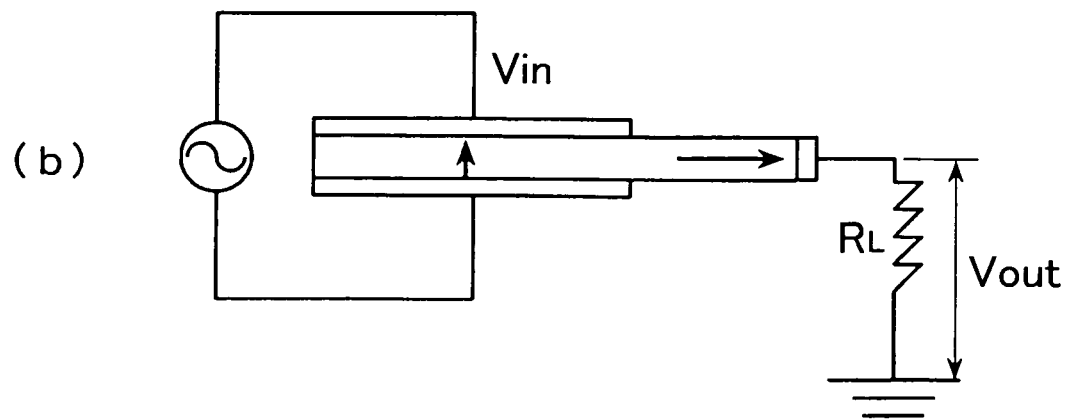

PIEZOELECTRIC TRANSFORMER DRIVING APPARATUS AND PIEZOELECTRIC TRANSFORMER DRIVING METHOD

TECHNICAL FIELD

The present invention relates to a piezoelectric transformer driving apparatus and a piezoelectric transformer driving method for lighting of a cold-cathode tube is used as a light source for a back-light which illuminates liquid crystals, used for a personal computer or the like, from a back side.

BACKGROUND ART

This kind of so-called Rosen type piezoelectric transformer is made by providing primary and secondary electrodes on a piezoelectric ceramic such as PZT and polarizing them respectively by high electric fields. When a voltage at a natural resonance frequency which is determined from a length direction is applied to the primary side, the element vibrates by an inverse piezoelectric effect, and it is possible to take out from a secondary side a voltage according to vibration by a piezoelectric effect.

A piezoelectric body can be obtained by applying a high electric field along a certain direction of a ceramic to align the crystal axes. Then, among piezoelectric bodies, when a tension is applied some generate positive charges in a positive direction of a coordinate axis of the force (a sign of piezo-electricity is positive), while others generate negative charges (a sign of piezo-electricity is negative).

FIG. 4 is an explanatory diagram of polarizations of secondary Rosen type piezoelectric transformers. When polarization directions (the arrows show the polarization directions) in secondary sides or primary sides of piezoelectric transformers made from a same material are reversed and a voltage at a resonance frequency is applied to the primary sides, electric potentials of opposite signs occur in the secondary sides respectively.

In the diagram, the polarization direction of the primary electrodes 2a and 2b of a piezoelectric transformer 2 is one which is reversed from the polarization direction of the primary electrodes 1a and 1b of a piezoelectric transformer 1. When a voltage at a resonance frequency is applied to the primary electrodes 1a and 1b and the same voltage is applied to the primary electrodes 2a and 2b, electric potentials of opposite signs respectively occur in the secondary electrodes 1c and 2c.

The polarization direction of the secondary electrode 3c of the piezoelectric transformer 3 is one which is reversed from a polarization direction of a secondary electrode 1c of the piezoelectric transformer 1. When a voltage at a resonance frequency is applied to the primary electrodes 1a and 1b and the same voltage is applied to the primary electrodes 3a and 3b, electric potentials of opposite signs occur respectively in the secondary electrodes 1c and 3c.

FIG. 5 is an explanatory diagram of a piezoelectric transformer driving method in a conventional example (patent document 1: Japanese Patent Laid-Open No. 2000-307165). In the two piezoelectric transformers used, the primary electrodes 1a and 1b of the piezoelectric transformer 1 and the primary electrodes 2a and 2b of the piezoelectric transformer 2 have polarization directions reverse to each other, and the secondary electrode 1c of the piezoelectric transformer 1 and the secondary electrode 2c of the piezoelectric transformer 2 have a mutually same polarization direction.

A cold-cathode tube L is connected between the secondary electrode 1c of the piezoelectric transformer 1 and the secondary electrode 2c of the piezoelectric transformer 2. One terminal from an AC power supply E is connected to the primary electrode 1a of the piezoelectric transformer 1 and the primary electrode 2a of the piezoelectric transformer 2, and the other terminal from the AC power supply E is connected to the primary electrode 1b of the piezoelectric transformer 1 and the primary electrode 2b of the piezoelectric transformer 2. Thus, the piezoelectric transformer 1 and piezoelectric transformer 2 are connected in parallel in view of the AC power supply E.

Since a polarization direction of the primary electrodes 1a and 1b of the piezoelectric transformer 1 and a polarization direction of the primary electrodes 2a and 2b of the piezoelectric transformer 2 are reverse, when a voltage at a resonance frequency is applied to the primary electrodes 1a and 1b and the primary electrodes 2a and 2b, a large voltage is applied to the cold-cathode tube L connected between the secondary electrodes 1c and 2c. For example, when a positive voltage is outputted from the secondary electrode 1c of the piezoelectric transformer 1, a negative voltage in reverse polarity is outputted from the secondary electrode 2c of the piezoelectric transformer 2.

Nevertheless, in the driving method of the piezoelectric transformers connected in parallel in the above-described conventional example, a plurality of resonance points (resonance frequencies f1 and f2 in FIG. 6) occur as shown in a transmission characteristic (the boost ratio characteristic to the frequency output voltage) shown in FIG. 6(a). In addition, FIG. 6(b) is a wiring diagram at the time of transmission characteristic measurement of FIG. 6(a). A reason why the plurality of resonance points occur is mainly that there is a variation among respective piezoelectric transformers. In addition, for the purpose of reference, a transmission characteristic at the time of using one piezoelectric transformer is shown in FIG. 7(a), and a wiring diagram at the time of its measurement is shown in FIG. 7(b). In FIG. 7, a range of higher frequency than a resonance point is the region of use. In order to dissolve two or more resonance points shown in FIG. 6(a), it is necessary to make a pair of piezoelectric transformers of identical properties. However, there was a problem that it was not easy to make all the properties of the piezoelectric transformers same even if the same materials were used and the manufacturing processes were managed.

The present invention is proposed in view of the above-mentioned problems, and aims at providing a piezoelectric transformer driving apparatus and a piezoelectric transformer driving method where an unnecessary resonance point does not come out near a frequency to be used, that is, an output is stable to the frequencies even if there is a variation between the respective piezoelectric transformers.

DISCLOSURE OF THE INVENTION

In order to solve the above-mentioned problems, the present invention is a piezoelectric transformer driving apparatus characterized in that the apparatus comprises a first piezoelectric transformer which comprises primary electrodes and a secondary electrode, and in which an output is obtained from the secondary electrode by applying an AC power supply to the primary electrodes, and a second piezoelectric transformer, which comprises primary electrodes and a secondary electrode, and in which an output is obtained from the secondary electrode by applying an AC power supply to the primary electrodes, being a piezoelectric transformer which outputs a voltage of phases reverse to phases of a voltage which the first piezoelectric transformer outputs, in which the primary electrodes of the first piezoelectric transformer and the primary electrodes of the second piezoelectric transformer are connected in series to where an AC power supply is to be applied, and a load is connected between the secondary electrode of the first piezoelectric transformer and the secondary electrode of the second piezoelectric transformer.

The present invention is a piezoelectric transformer driving apparatus characterized in that the apparatus comprises a first piezoelectric transformer which comprises primary electrodes and a secondary electrode, and in which an output is obtained from the secondary electrode by applying an AC power supply to the primary electrodes, and a second piezoelectric transformer, which comprises primary electrodes and a secondary electrode, and in which an output is obtained from the secondary electrode by applying an AC power supply to the primary electrodes, being a piezoelectric transformer in which a polarization direction in its primary electrode side is mutually reverse to a polarization direction in a primary electrode side of the first piezoelectric transformer, and a polarization direction in its secondary electrode side is mutually the same as a polarization direction of the first piezoelectric transformer, in which the primary electrodes of the first piezoelectric transformer and the primary electrodes of the second piezoelectric transformer are connected in series to where an AC power supply is to be applied, and a load is connected between the secondary electrode of the first piezoelectric transformer and the secondary electrode of the second piezoelectric transformer.

The present invention is a piezoelectric transformer driving apparatus characterized in that the apparatus comprises a first piezoelectric transformer which comprises primary electrodes and a secondary electrode, and in which an output is obtained from the secondary electrode by applying an AC power supply to the primary electrodes, and a third piezoelectric transformer, which comprises primary electrodes and a secondary electrode, and in which an output is obtained from the secondary electrode by applying an AC power supply to the primary electrodes, being a piezoelectric transformer in which a polarization direction in its primary electrode side is mutually the same as a polarization direction in a primary electrode side of the first piezoelectric transformer, and a polarization direction in its secondary electrode side is mutually reverse to a polarization direction of the first piezoelectric transformer, in which the primary electrodes of the first piezoelectric transformer and the primary electrodes of the third piezoelectric transformer are connected in series to where an AC power supply is to be applied, and a load is connected between the secondary electrode of the first piezoelectric transformer and the secondary electrode of the third piezoelectric transformer.

The present invention is a piezoelectric transformer driving method characterized in that as to primary electrodes of a first piezoelectric transformer and primary electrodes of a second piezoelectric transformer, polarization directions are reverse to each other; as to a secondary electrode of the first piezoelectric transformer and a secondary electrode of the second piezoelectric transformer, polarization directions are same with each other; one of the primary electrodes of the first piezoelectric transformer and one of the primary electrodes of the second piezoelectric transformer are connected, so that the first piezoelectric transformer and the second piezoelectric transformer are connected in series to an AC power supply; a load is connected between the secondary electrode of the first piezoelectric transformer and the secondary electrode of the second piezoelectric transformer; and an AC voltage is applied between the primary electrodes of the first and second piezoelectric transformers connected in series, to drive the piezoelectric transformers.

The present invention is a piezoelectric transformer driving method characterized in that as to primary electrodes of a first piezoelectric transformer and primary electrodes of a third piezoelectric transformer, polarization directions are same with each other; as to a secondary electrode of the first piezoelectric transformer and a secondary electrode of the third piezoelectric transformer, polarization directions are reverse to each other; one of the primary electrodes of the first piezoelectric transformer and one of the primary electrodes of the third piezoelectric transformer are connected, so that the first piezoelectric transformer and the third piezoelectric transformer are connected in series to an AC power supply; a load is connected between the secondary electrode of the first piezoelectric transformer and the secondary electrode of the third piezoelectric transformer; and an AC voltage is applied between the primary electrodes of the first and third piezoelectric transformers connected in series, to drive the piezoelectric transformers.

As described above, according to the present invention, since respective piezoelectric transformers which generate voltages of opposite signs in the secondary electrodes when a resonance frequency is applied to the primary electrodes are connected in series to an AC power supply, a load is connected to the secondary electrodes of both piezoelectric transformers, and an AC voltage is applied between the primary electrodes of the respective piezoelectric transformers connected in series, it is possible to make it have a single resonance point even if there is a variation between the vibration of respective piezoelectric transformers, as well as to generate a large voltage between secondary electrodes. In addition, since a load does not have an earth point and is balanced against the ground, it is possible to reduce a leakage current.

According to the present invention, even when the polarities in the primary electrode sides and the polarities in the secondary electrode sides are made reverse to the ones in the above-mentioned structure respectively, similarly to the above-mentioned structure, it is possible to make it have a single resonance point even if there is a variation between the vibration of respective piezoelectric transformers, as well as to generate a large voltage between the secondary electrodes.

BRIEF DESCRIPTION OF THE DRAWINGS

FIG. 3(a) is a graph showing a transmission characteristic of a piezoelectric transformers in one embodiment of the present invention, and FIG. 3(b) is a wiring diagram of the piezoelectric transformers in the one embodiment of the present invention;

FIG. 6(a) is a graph showing a transmission characteristic of the piezoelectric transformers in the conventional example, and FIG. 6(b) is a wiring diagram of the piezoelectric transformers in the conventional example; and FIG. 7(*a*) is a graph showing a transmission characteristic of a common piezoelectric transformer, and FIG. 7(*b*) is a wiring diagram of the common piezoelectric transformer.

BEST MODE FOR CARRYING OUT THE INVENTION

The present invention is a piezoelectric transformer driving method in which there is no unnecessary resonance point near a frequency to be used, having a load balanced against the ground, having no earth point, and the leakage current is small, in spite of obtaining a large output by a pair of piezoelectric transformers.

Figure 1:
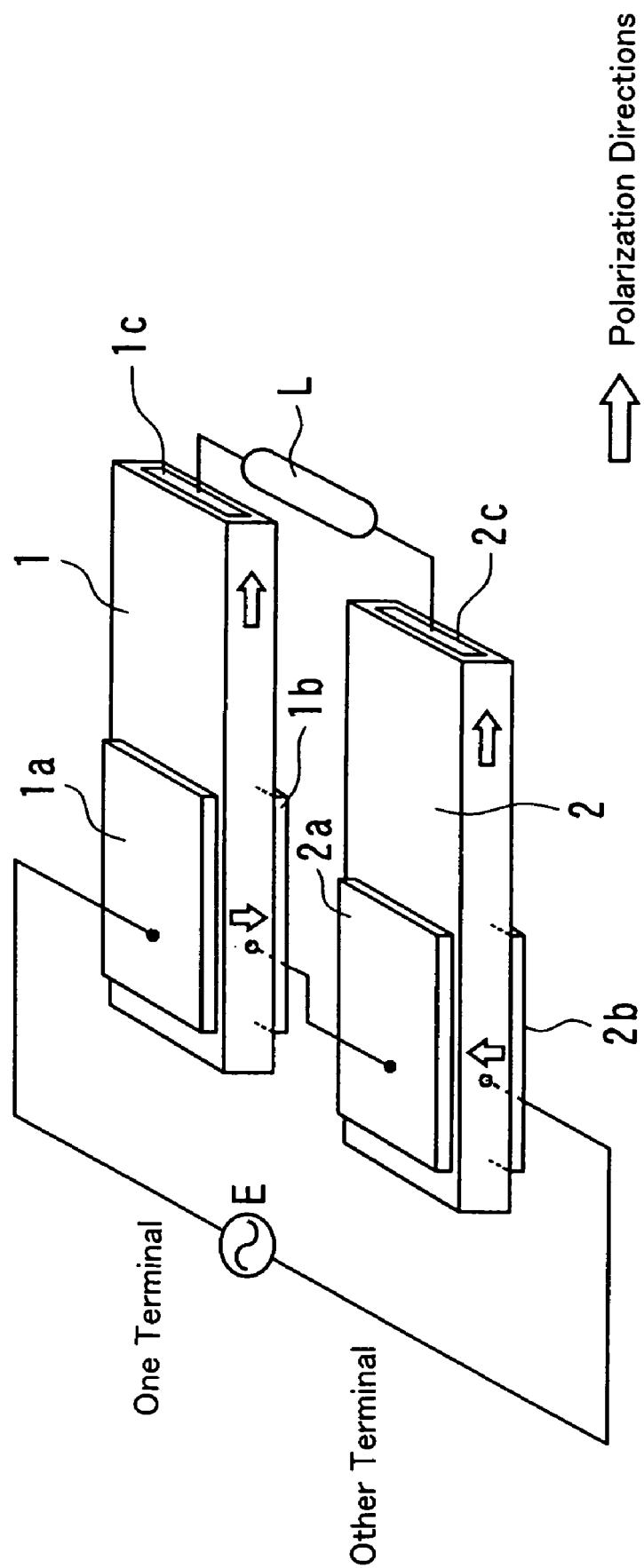
FIG. 1 is an explanatory diagram of a piezoelectric transformer driving apparatus and a piezoelectric transformer driving method in a first embodiment of the present invention.

FIG. 1 is an explanatory diagram of a piezoelectric transformer driving apparatus and a piezoelectric transformer driving method in a first embodiment of the present invention. In the diagram, reference numeral 1 denotes a piezoelectric transformer, reference characters 1*a* and 1*b* denote primary electrodes of the piezoelectric transformer 1, reference character 1*c* denotes a secondary electrode of the piezoelectric transformer 1, reference numeral 2 denotes a piezoelectric transformer, reference characters 2*a* and 2*b* denote primary electrodes of the piezoelectric transformer 2, reference character 2*c* denotes a secondary electrode of the piezoelectric transformer 2, reference character E denotes an AC power supply, and reference character L denotes a cold-cathode tube as a load.

The cold-cathode tube L is connected between the secondary electrode 1*c* of the piezoelectric transformer 1, and the secondary electrode 2*c* of the piezoelectric transformer 2, the primary electrode 1*b* of the piezoelectric transformer 1, and the primary electrode 2*a* of the piezoelectric transformer 2 are connected directly, and the piezoelectric transformer 1 and the piezoelectric transformer 2 are connected in series to the AC power supply E. One terminal from the AC power supply E is connected to the primary electrode 1*a* of the piezoelectric transformer 1, and the other terminal is connected to the primary electrode 2*b* of the piezoelectric transformer 2.

An AC voltage from the AC power supply E is applied as an input voltage between the primary electrodes 1*a* and 2*b* of the piezoelectric transformers 1 and 2 whose primary electrodes 1*b* and 2*a* are connected. Since voltages of different signs occur at the secondary electrode 1*c* and the secondary electrode 2*c*, a large voltage, which is the sum of the voltage generated at the secondary electrode 1*c* and the voltage generated at the secondary electrode 2*c*, is applied to the cold-cathode tube L. In addition, it is not necessary that piezoelectric transformers to be used are limited to Rosen type piezoelectric transformers, or ones of laminated type or of single plate type.

Figure 2:
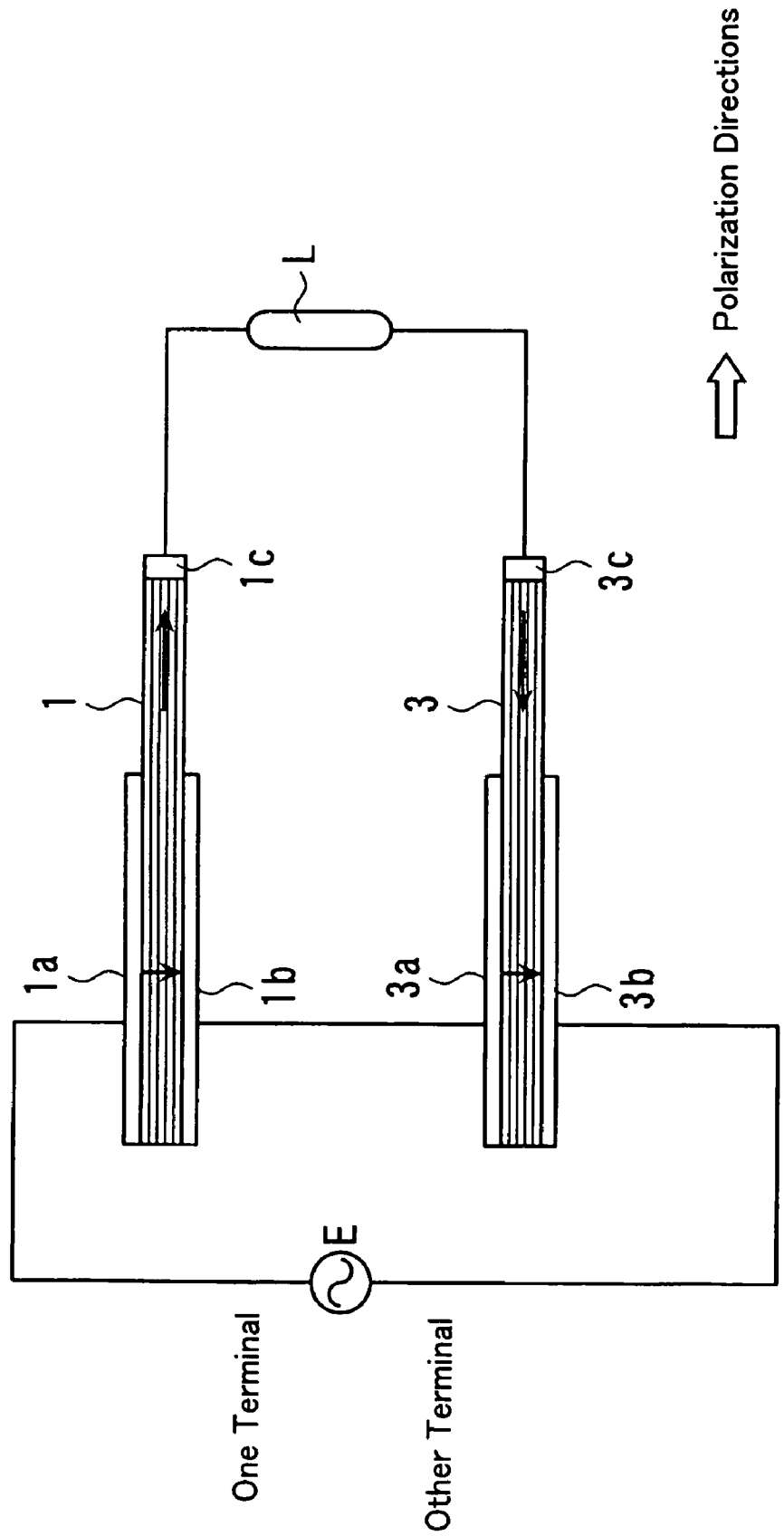
FIG. 2 is an explanatory diagram of a piezoelectric transformer driving apparatus and a piezoelectric transformer driving method in a second embodiment of the present invention.
Figure 4:
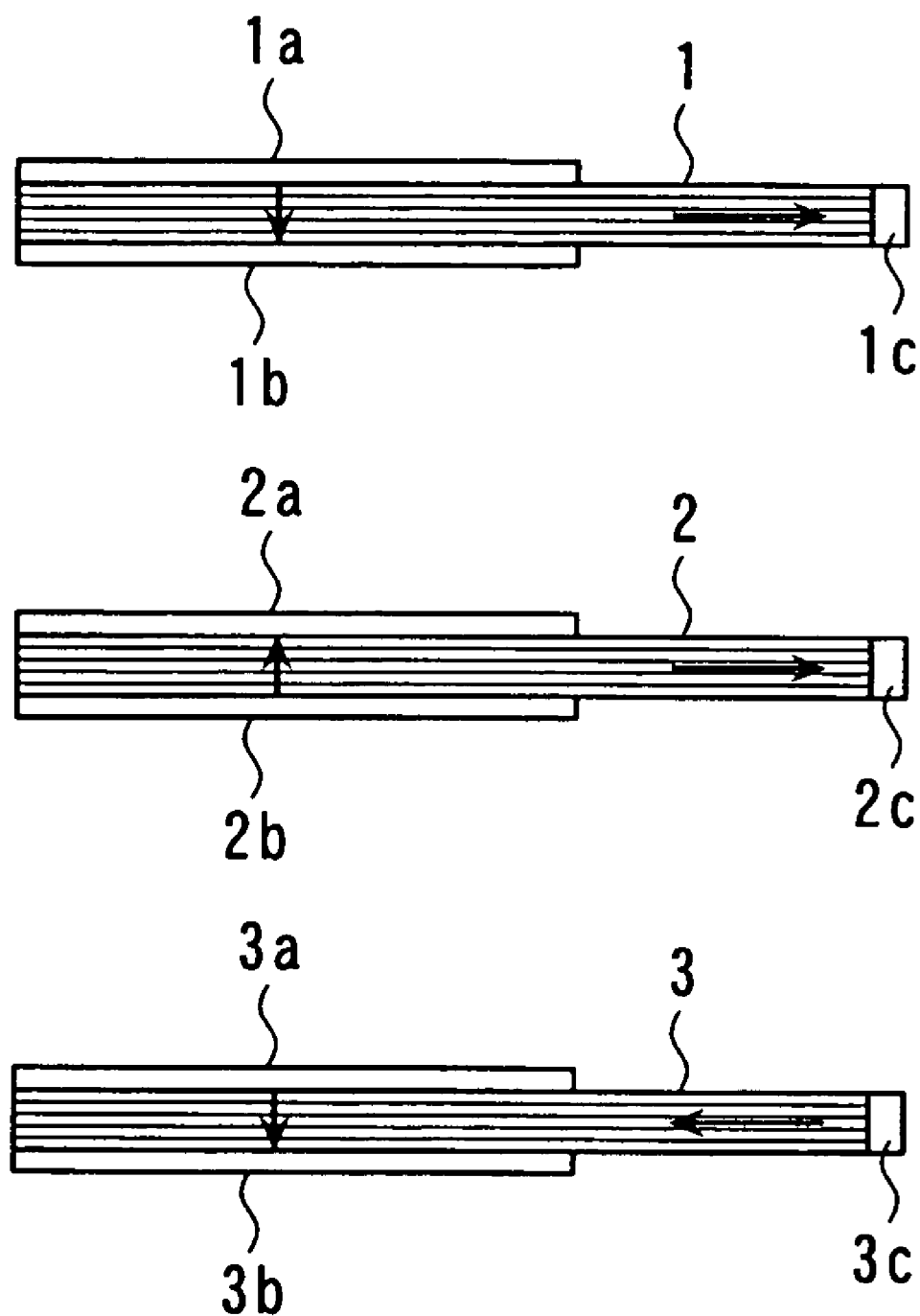
FIG. 4 is an explanatory diagram of piezoelectric transformers.
Figure 5:
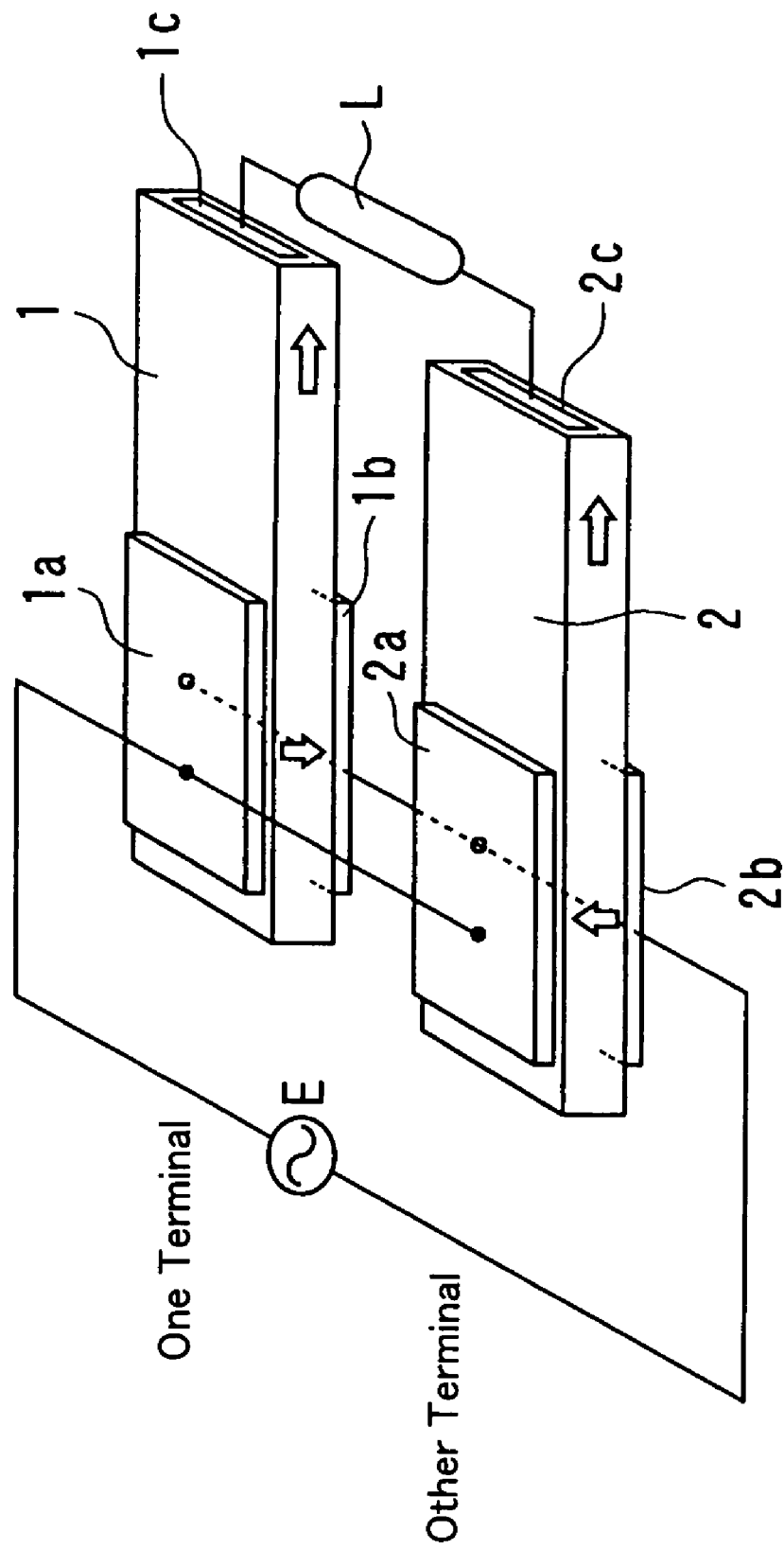
FIG. 5 is an explanatory diagram of a piezoelectric transformer driving method in a conventional example.

FIG. 2 is an explanatory diagram of a piezoelectric transformer driving apparatus and a piezoelectric transformer driving method in a second embodiment of the present invention. In the diagram, reference numeral 3 denotes a piezoelectric transformer, reference characters 3*a* and 3*b* denote primary electrodes of the piezoelectric transformer 3, and reference character 3*c* denotes a secondary electrode of the piezoelectric transformer 3. In addition, those assigned the same reference numerals as in FIG. 1 denote the same components, respectively, and hence, their descriptions will be omitted.

The second embodiment is one in which the piezoelectric transformer 2 in the first embodiment is replaced by the piezoelectric transformer 3, and which has the same effect as the first embodiment. That is, an AC voltage from the AC power supply E is applied as an input voltage between the primary electrodes 1*a* and 3*b* of the piezoelectric transformers 1 and 3 whose primary electrodes 1*b* and 3*a* are connected. Since voltages of different signs occur at the secondary electrode 1*c* and the secondary electrode 3*c*, a large voltage, which is the sum of the voltage generated at the secondary electrode 1*c* and the voltage generated at the secondary electrode 3*c*, is applied to the cold-cathode tube L.

FIG. 3(*a*) is a graph showing a transmission characteristic of piezoelectric transformers which are connected in series, in an embodiment of the present invention. In addition, FIG. 3(*b*) is a wiring diagram at the time of transmission characteristic measurement of FIG. 3(*a*). In the case of FIG. 3(*a*), even if there is a variation in input impedances at respective resonance frequencies of the two piezoelectric transformers, AC voltages in inverse proportion to impedance values are applied to respective piezoelectric transformers, and hence, an output voltage is complemented. The vertical axis in the transmission characteristic graph of the piezoelectric transformers in FIG. 3(*a*) is the boost ratio (output voltage) of the piezoelectric transformers which are connected in series, and the horizontal axis is the frequency. The transmission characteristic shows that there is only one resonance point, that is, f0 even if there is a variation between the respective piezoelectric transformers.

INDUSTRIAL APPLICABILITY

As described above, the piezoelectric transformer driving apparatus and the piezoelectric transformer driving method according to the present invention are useful for cold-cathode tube lighting. In particular, when a cold-cathode tube is used as a light source for a back-light which illuminates liquid crystals used for a personal computer or the like, from a back side, they are suitable for lighting the cold-cathode tube.

The invention claimed is:

1. A piezoelectric transformer driving apparatus characterized in that the apparatus comprises:
    a first piezoelectric transformer (1) which comprises primary electrodes (1*a* and 1*b*) and a secondary electrode (1*c*), and in which an output is obtained from the secondary electrode (1*c*) by applying an AC power supply to the primary electrodes (1*a* and 1*b*); and
    a second piezoelectric transformer (2), which comprises primary electrodes (2*a* and 2*b*) and a secondary electrode (2*c*), and in which an output is obtained from the secondary electrode (2*c*) by applying an AC power supply to the primary electrodes (2*a* and 2*b*), being a piezoelectric transformer which outputs a voltage of phases reverse to phases of a voltage which the first piezoelectric transformer (1) outputs,
    wherein the primary electrodes (1*a* and 1*b*) of the first piezoelectric transformer (1) and the primary electrodes (2*a* and 2*b*) of the second piezoelectric transformer (2) are connected in series to where an AC power supply is to be applied, and a load (L) is connected between the secondary electrode (1*c*) of the first piezoelectric transformer (1) and the secondary electrode (2*c*) of the second piezoelectric transformer (2),
    wherein transmission characteristics of said first piezoelectric transformer (1) and said second piezoelectric transformer (2) have only one resonance point f0 even if there is a variation in input impedances at respective resonance frequencies between said first and second piezoelectric transformers (1,2).

2. A piezoelectric transformer driving apparatus characterized in that the apparatus comprises:
    a first piezoelectric transformer (1) which comprises primary electrodes (1*a* and 1*b*) and a secondary electrode (1c), and in which an output is obtained from the secondary electrode (1c) by applying an AC power supply to the primary electrodes (1a and 1b); and a second piezoelectric transformer (2), which comprises primary electrodes (2a and 2b) and a secondary electrode (2c), and in which an output is obtained from the secondary electrode (2c) by applying an AC power supply to the primary electrodes (2a and 2b), being a piezoelectric transformer in which a polarization direction in its primary electrode side is mutually reverse to a polarization direction in a primary electrode side of the first piezoelectric transformer (1), and a polarization direction in its secondary electrode side is mutually the same as a polarization direction of the first piezoelectric transformer (1), wherein the primary electrodes (1a and 1b) of the first piezoelectric transformer (1) and the primary electrodes (2a and 2b) of the second piezoelectric transformer (2) are connected in series to where an AC power supply is to be applied, and a load (L) is connected between the secondary electrode (1c) of the first piezoelectric transformer (1) and the secondary electrode (2c) of the second piezoelectric transformer (2), wherein transmission characteristics of said first piezoelectric transformer (1) and said second piezoelectric transformer (2) have only one resonance point f0 even if there is a variation in input impedances at respective resonance frequencies between said first and second piezoelectric transformers (1,2).

3. A piezoelectric transformer driving apparatus characterized in that the apparatus comprises:

a first piezoelectric transformer (1) which comprises primary electrodes (1a and 1b) and a secondary electrode (1c), and in which an output is obtained from the secondary electrode (1c) by applying an AC power supply to the primary electrodes (1a and 1b); and a third piezoelectric transformer (3), which comprises primary electrodes (3a and 3b) and a secondary electrode (3c), and in which an output is obtained from the secondary electrode (3c) by applying an AC power supply to the primary electrodes (3a and 3b), being a piezoelectric transformer in which a polarization direction in its primary electrode side is mutually the same as a polarization direction in a primary electrode side of the first piezoelectric transformer (1), and a polarization direction in its secondary electrode side is mutually reverse to a polarization direction of the first piezoelectric transformer (1), wherein the primary electrodes (1a and 1b) of the first piezoelectric transformer (1) and the primary electrodes (3a and 3b) of the third piezoelectric transformer (3) are connected in series to where an AC power supply is to be applied, and a load (L) is connected between the secondary electrode (1c) of the first piezoelectric transformer (1) and the secondary electrode (3c) of the third piezoelectric transformer (3), wherein transmission characteristics of said first piezoelectric transformer (1) and said third piezoelectric transformer (3) have only one resonance point f0 even if there is a variation in input impedances at respective resonance frequencies between said first and third piezoelectric transformers (1,3).

4. A piezoelectric transformer driving method characterized in that as to primary electrodes (1a and 1b) of a first piezoelectric transformer (1) and primary electrodes (2a and 2b) of a second piezoelectric transformer (2), polarization directions are reverse to each other;

as to a secondary electrode (1c) of the first piezoelectric transformer (1) and a secondary electrode (2c) of the second piezoelectric transformer (2), polarization directions are same with each other;

one of the primary electrodes (1b) of the first piezoelectric transformer (1) and one of the primary electrodes (2a) of the second piezoelectric transformer (2) are connected, so that the first piezoelectric transformer (1) and the second piezoelectric transformer (2) are connected in series to an AC power supply (E);

a load (L) is connected between the secondary electrode (1c) of the first piezoelectric transformer (1) and the secondary electrode (2c) of the second piezoelectric transformer (2); and an AC voltage is applied between the primary electrodes (1a and 2b) of the first and second piezoelectric transformers (1 and 2) connected in series, to drive the piezoelectric transformers, wherein transmission characteristics of said first piezoelectric transformer (1) and said second piezoelectric transformer (2) have only one resonance point f0 even if there is a variation in input impedances at respective resonance frequencies between said first and second piezoelectric transformers (1,2).

5. A piezoelectric transformer driving method characterized in that as to primary electrodes (1a and 1b) of a first piezoelectric transformer (1) and primary electrodes (3a and 3b) of a third piezoelectric transformer (3), polarization directions are same with each other;

as to a secondary electrode (1c) of the first piezoelectric transformer (1) and a secondary electrode (3c) of the third piezoelectric transformer (3), polarization directions are reverse to each other;

one of the primary electrodes (1b) of the first piezoelectric transformer (1) and one of the primary electrodes (3a) of the third piezoelectric transformer (3) are connected, so that the first piezoelectric transformer (1) and the third piezoelectric transformer (3) are connected in series to an AC power supply (E);

a load (L) is connected between the secondary electrode (1c) of the first piezoelectric transformer (1) and the secondary electrode (3c) of the third piezoelectric transformer (3); and an AC voltage is applied between the primary electrodes (1a and 3b) of the first and third piezoelectric transformers (1 and 3) connected in series, to drive the piezoelectric transformers, wherein transmission characteristics of said first piezoelectric transformer (1) and said third piezoelectric transformer (3) have only one resonance point f0 even if there is a variation in input impedances at respective resonance frequencies between said first and third piezoelectric transformers (1,3).

* * * * *